(12) United States Patent
Tobin et al.

(10) Patent No.: US 9,048,190 B2
(45) Date of Patent: Jun. 2, 2015

(54) METHODS AND APPARATUS FOR PROCESSING SUBSTRATES USING AN ION SHIELD

(71) Applicant: APPLIED MATERIALS, INC., Santa Clara, CA (US)

(72) Inventors: Jeffrey Tobin, Mountain View, CA (US); Bernard L. Hwang, Santa Clara, CA (US); Canfeng Lai, Fremont, CA (US); Lara Hawrylchak, San Jose, CA (US); Wei Liu, San Jose, CA (US); Johanes Swenberg, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/044,090

(22) Filed: Oct. 2, 2013

(65) Prior Publication Data

US 2014/0099795 A1 Apr. 10, 2014

Related U.S. Application Data

(60) Provisional application No. 61/711,495, filed on Oct. 9, 2012.

(51) Int. Cl.
| | |
|---|---|
| *H01L 21/311* | (2006.01) |
| *H01L 21/461* | (2006.01) |
| *H01L 21/3065* | (2006.01) |
| *H01L 21/67* | (2006.01) |

(52) U.S. Cl.
CPC ...... *H01L 21/3065* (2013.01); *H01L 21/31116* (2013.01); *H01L 21/67069* (2013.01)

(58) Field of Classification Search
CPC .............. H01J 37/32422; H01L 21/67069; H01L 21/31116
See application file for complete search history.

(56) References Cited

U.S. PATENT DOCUMENTS

| | | | |
|---|---|---|---|
| 8,349,128 B2 | 1/2013 | Todorow et al. | |
| 2005/0263484 A1 | 12/2005 | Park et al. | |
| 2006/0000802 A1* | 1/2006 | Kumar et al. | 216/67 |
| 2007/0020944 A1 | 1/2007 | Chae et al. | |
| 2011/0162797 A1* | 7/2011 | Kumar et al. | 156/345.26 |
| 2011/0315319 A1* | 12/2011 | Forster et al. | 156/345.29 |
| 2012/0228261 A1 | 9/2012 | Watanabe et al. | |
| 2012/0318773 A1* | 12/2012 | Wu et al. | 216/68 |

FOREIGN PATENT DOCUMENTS

| | | |
|---|---|---|
| KR | 10-2007-003172 A | 1/2007 |
| WO | WO 2011/062162 A1 | 5/2011 |

OTHER PUBLICATIONS

International Search Report and Written Opinion mailed Jan. 28, 2014 for PCT Application No. PCT/US2013/063197.

* cited by examiner

*Primary Examiner* — Duy Deo
(74) *Attorney, Agent, or Firm* — Moser Taboada; Alan Toboada

(57) ABSTRACT

Methods and apparatus for processing a substrate are provided. In some embodiments, a method of processing a substrate having a first layer may include disposing a substrate atop a substrate support in a lower processing volume of a process chamber beneath an ion shield having a bias power applied thereto, the ion shield comprising a substantially flat member supported parallel to the substrate support, and a plurality of apertures formed through the flat member, wherein the ratio of the aperture diameter to the thickness flat member ranges from about 10:1-1:10; flowing a process gas into an upper processing volume above the ion shield; forming a plasma from the process gas within the upper processing volume; treating the first layer with neutral radicals that pass through the ion shield; and heating the substrate to a temperature of up to about 550 degrees Celsius while treating the first layer.

14 Claims, 4 Drawing Sheets

METHODS AND APPARATUS FOR PROCESSING SUBSTRATES USING AN ION SHIELD

CROSS-REFERENCE TO RELATED APPLICATIONS

This application claims benefit of U.S. provisional patent application Ser. No. 61/711,495, filed Oct. 9, 2012, which is herein incorporated by reference.

FIELD

Embodiments of the present invention generally relate to semiconductor processing equipment.

BACKGROUND

The inventors have observed that nitridation of 3D device structures cannot be easily performed using typical plasma ion exposure due to the non-conformal nature of the plasma sheath, which prevents conformal doping of the top surface of a film and the device sidewall. Instead, the inventors believe that 3D conformal nitridation requires radical or neutral species driven reactions. One method of nitridizing a hafnium oxide based 3D high-k gate stack is through the use of an inductively coupled plasma generated using ammonia and, optionally, an inert gas, and/or nitrogen gas ($N_2$). However, the inventors have observed that this process also leads to the formation of a number of reactive hydrogen species, including both hydrogen radicals and hydrogen ions. These reactive hydrogen species can potentially penetrate the nitridized film and negatively interact with the gate stack materials. Additionally, the inventors have observed that this process also leads to the formation of a number of inert gas and/or nitrogen ions, which also undesirably contribute to the non-conformal processing results. The inventors propose that reducing or eliminating the reactive hydrogen species prior to their penetration and interaction with the gate stack materials can prevent device failure, and reducing or eliminating the inert gas and/or ions prior to their interaction with the substrate can enhance conformal processing results.

As such, the inventors have provided improved methods and apparatus for nitridizing materials, such as those in 3D device structures.

SUMMARY

Methods and apparatus for processing a substrate are provided herein. In some embodiments, such processing includes nitridizing a substrate. In some embodiments, a method of processing a substrate having a first layer disposed thereon, for example that is part of a 3D device disposed on or being fabricated on the substrate, may include disposing a substrate atop a substrate support disposed in a lower processing volume of a process chamber beneath an ion shield having a bias power applied thereto, wherein the ion shield comprises a substantially flat member supported parallel to the substrate support, and a plurality of apertures formed through the flat member, and wherein the ratio of the diameter of the apertures to the thickness of the flat member has a range of about 10:1 to about 1:10; flowing a process gas into an upper processing volume above the ion shield; forming a plasma from the process gas within the upper processing volume; treating the first layer with neutral radicals that pass through the ion shield; and heating the substrate to a temperature of up to about 550 degrees Celsius while treating the first layer.

In some embodiments, a substrate processing apparatus may include a chamber body defining a processing volume having an upper processing volume and a lower processing volume; a substrate support disposed within the lower processing volume; an ion shield disposed in the processing volume and dividing the processing volume into the upper processing volume and the lower processing volume, the ion shield comprising a substantially flat member supported parallel to the substrate support, and having a plurality of apertures formed through the substantially flat member, wherein the ratio of the diameter of the apertures to the thickness of the substantially flat member has a range of about 10:1 to about 1:10; a biasing power source coupled to the ion shield; a shield support disposed within the processing volume configured to support the ion shield above the substrate support in a substantially parallel orientation with respect to the substrate; a heat source to provide heat energy to a substrate when disposed on the substrate support; and an RF power source for forming a plasma within the upper processing volume.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
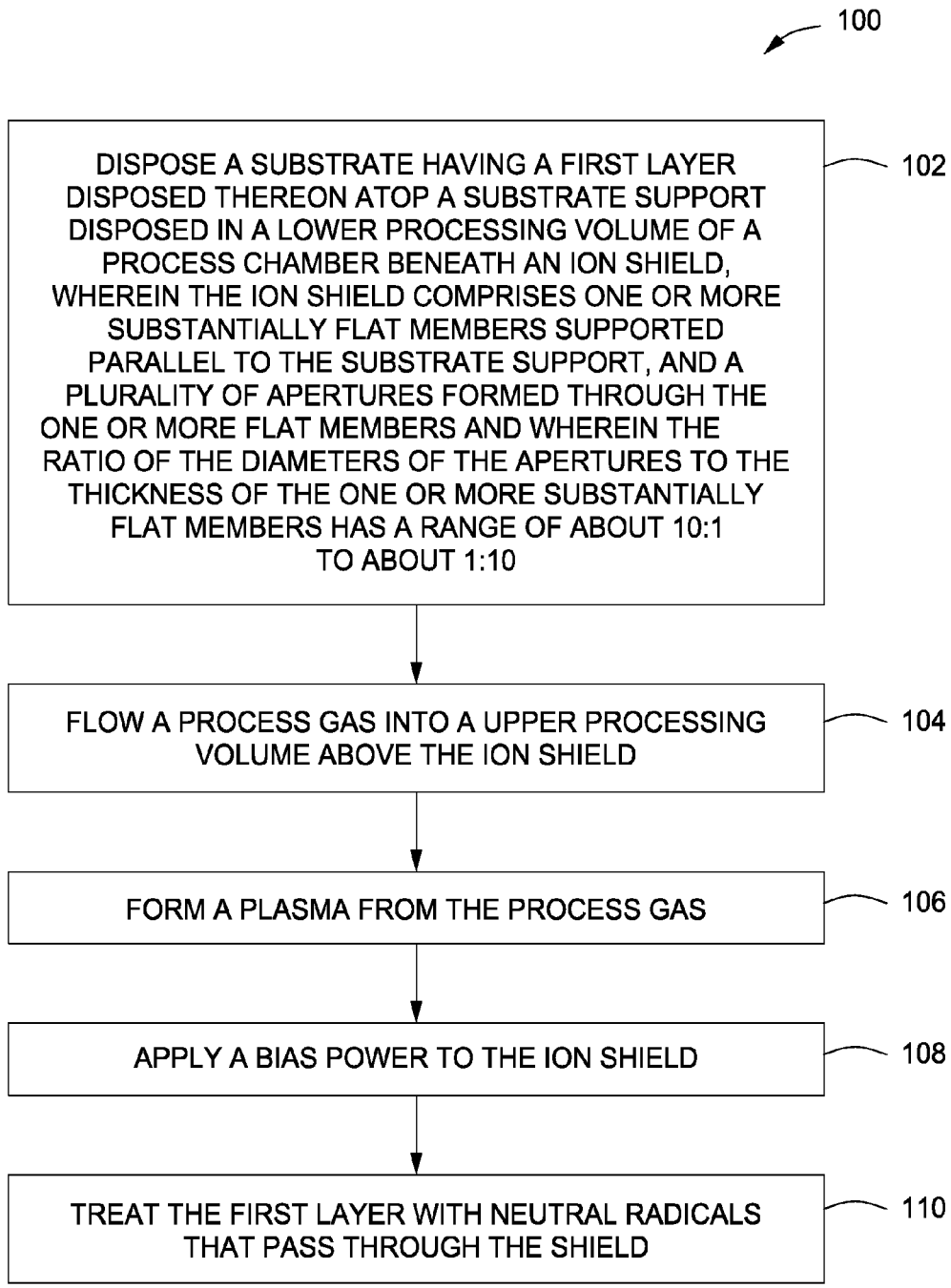
FIG. 1 depicts a flow chart for a method of processing a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide improved methods and apparatus for processing a substrate. Embodiments of the present invention may advantageously allow for the conformal nitridation of 3D structures, such as high-k materials used in 3D structures, by reducing the impact of reactive species, such as hydrogen radicals and hydrogen ions, as well as other ions, resulting from an inductively coupled plasma formed from an ammonia source. The methods and apparatus may also be used to nitridize other materials in other applications including those not having 3D structures.

Figure 2A:
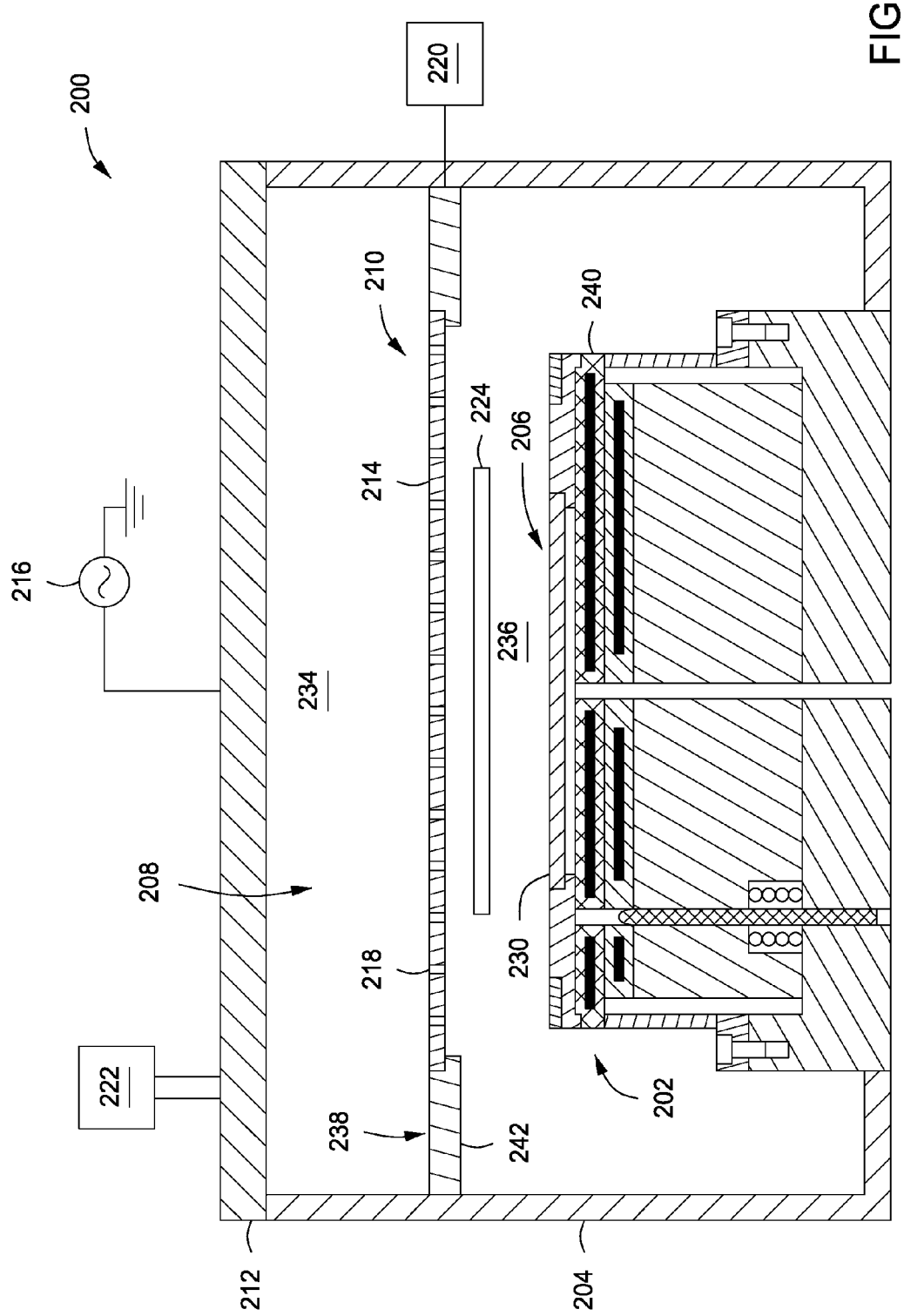
FIGS. 2A-2B depict a schematic view of a substrate processing chamber in accordance with some embodiments of the present invention.
Figure 2B:
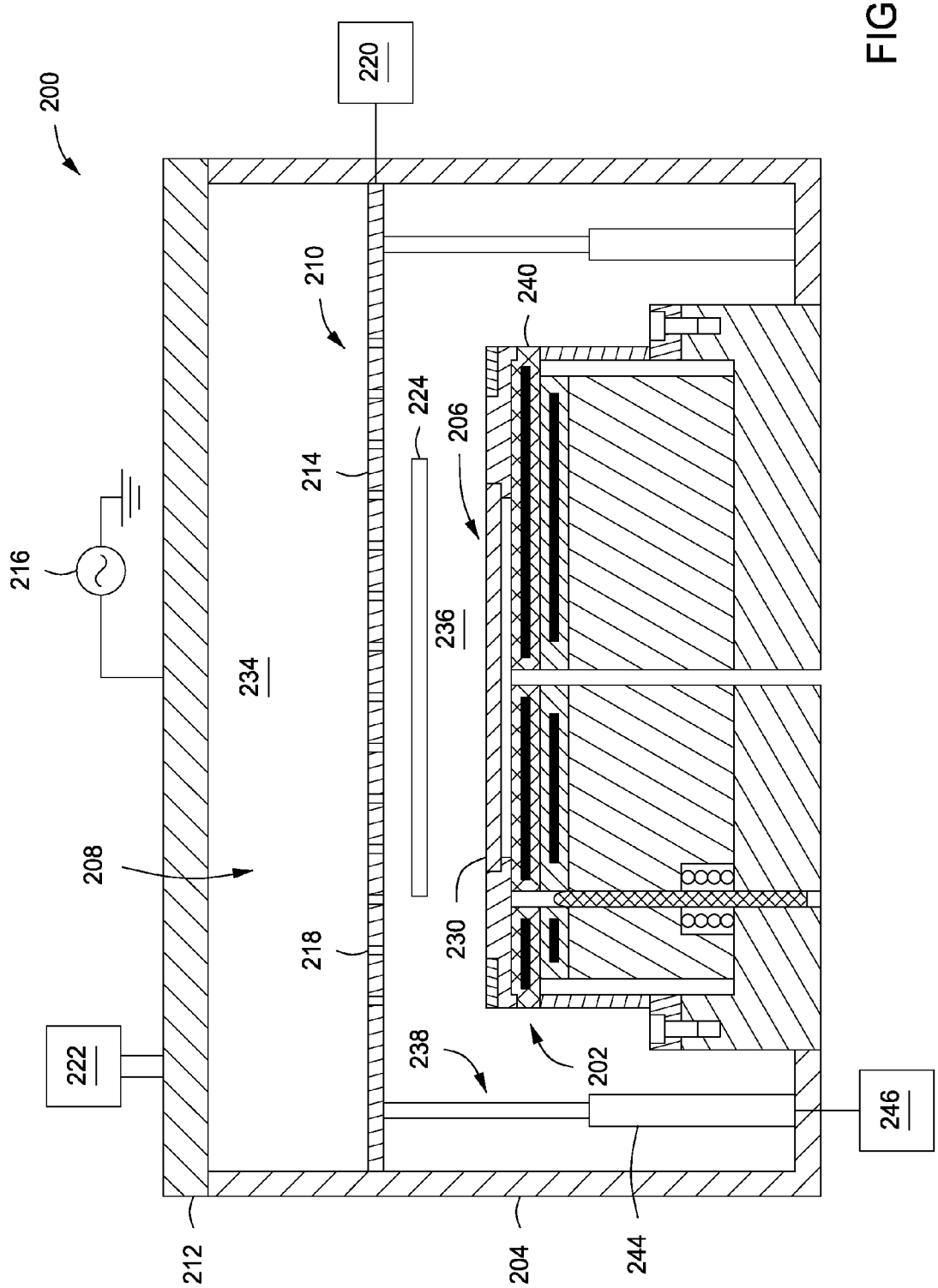

FIGS. 2A and 2B depict particular embodiments of a process chamber 200 for processing substrates in accordance with some embodiments of the present invention. The process chamber 200 is depicted for illustrative purposes and should not be used to limit the scope of the invention. In the depicted embodiment, the process chamber 200 has a substantially flat dielectric ceiling 212. However, other modifications of the process chamber 200 may have other types of ceilings, for example, a dome-shaped ceiling.

The process chamber 200 depicted in FIGS. 2A and 2B generally comprises a substrate support 202 and a slit valve 224 within a chamber body 204. The slit valve 224 allows the ingress and egress of a substrate 206 to and from the substrate support 202. The substrate support 202 has an upper surface to support the substrate 206 such that a first layer 230 of the substrate 206 is positioned for processing. In some embodiments, the process chamber 200 further comprises a heat source 240 to heat the substrate 206 to a desired temperature. The heat source 240 may be any type of heat source suitable to provide control over the substrate temperature, for example a resistive heater coupled to the substrate support 202 or heat lamps (not shown) disposed in a position to provide heat energy to the surface of the substrate 206 either directly or through some other component. For example, in some embodiments, the heat source 240 is the resistive heater disposed within an electrostatic chuck, which advantageously enhances temperature control of the substrate due to enhanced thermal contact between the substrate and the electrostatic chuck due to the clamping force provided by the electrostatic chuck.

The chamber body 204 defines a processing volume 208 divided into an upper processing volume 234 and a lower processing volume 236 by an ion shield 210 disposed within the processing volume 208. The upper processing volume 234 is disposed above the ion shield 210 and the lower processing volume 236 is disposed below the ion shield 210. The upper processing volume 234 and the lower processing volume 236 are fluidly coupled by openings in the ion shield 210.

A process gas source 222 is coupled to the process chamber 200 to supply a process gas to the upper processing volume 234. In some embodiments, the process gas is a nitrogen containing gas, for example ammonia ($NH_3$), alone or in combination with an inert gas, such as argon (Ar) or the like, which is suitable for a nitridation process. In some embodiments, the process gas is an oxygen containing gas, such as oxygen ($O_2$), suitable for an oxidation process. In some embodiments, the process gas is a halogen containing gas, such as chlorine ($Cl_2$), fluorine ($F_2$), bromine ($Br_2$), nitrogen trifluoride ($NF_3$), trifluoromethane ($CHF_3$), hydrogen chloride (HCl), hydrogen bromide (HBr), or the like, suitable for an etch process.

A plasma can be formed in the upper processing volume 234 from the process gas by applying RF power from a plasma power source 216. The plasma power source 216 can be coupled to an electrode disposed in or near the ceiling 212 of the process chamber suitable to couple RF power to the process gases disposed in the process chamber. For example, the plasma power source 216 and the electrode can be configured to form a capacitively coupled plasma, and inductively coupled plasma, or the like.

The plasma may form reactive species, such as in a nitridation process where the plasma can form hydrogen radicals and hydrogen ions, as well as nitrogen and/or inert gas ions, in addition to the other components of the plasma. These reactive hydrogen species can potentially penetrate the nitridized film and negatively interact with the substrate or materials disposed on the substrate. In addition, inert or nitrogen gas ions can also negatively impact conformal reactions or processing of three-dimensional structures on the substrate. The ion shield 210 advantageously controls the spatial distribution of the reactive and neutral species in the process chamber 200 during nitridation, or other, processes. Specifically, the ion shield 210 substantially prevents the reactive hydrogen species and other ions from reaching the substrate 206 in the lower process volume 236. Moreover, the ion shield 210 allows species with high surface recombination rates, such as hydrogen radicals, to recombine preferentially on the surface of the ion shield 210, leaving a higher relative concentration of desirable species (for example, nitrogen-containing species in a nitridation process) to reach the surface of the substrate 206.

In some embodiments, the ion shield 210 is coupled to a bias power source 220 which advantageously allows for the selective biasing of the ion shield 210 to enhance ion screening (e.g., reduction of charged radicals and ions) during the nitridation process. The bias power source can be a DC power source or an RF power source. For example, a negative voltage applied to the ion shield 210 can enhance the screening of positive ions by attracting the positive ions to the surface of the ion shield 210. The ion shield 210 is made of a conductive material such as aluminum, anodized aluminum, aluminum oxide, or quartz. In some embodiments, the ion shield 210 is electrically isolated from the chamber body 204 and the substrate support 202. In some embodiments, the ion shield 210 is grounded, for example by electrically coupling to the chamber body 204 and/or the substrate support 202. The choice of material used for the ion shield 210 can be selected to contribute to the control of the recombination rate at the surface of the ion shield 210. For example, hydrogen radicals recombine more readily on an aluminum surface than on a quartz surface.

The ion shield 210 is supported above the substrate support 202 by a support element. In some embodiments, the height at which the ion shield 210 is supported may vary in order to control the process within the process chamber 200. For example, in an etch process, a faster etch rate may be obtained by locating the ion shield 210 closer to the substrate support 202 and, therefore, the substrate 206. Alternatively, a lower, but more controlled, etch rate may be obtained by locating the ion shield 210 farther from substrate support 202. In some embodiments, the height of the ion shield 210 may range from about 0.5 inches (3.81 cm) to about 5.5 inches (10.16 cm) in a process chamber 200 having a distance of about 6 inches (15.24 cm) between the substrate 206 and the ceiling 212. In some embodiments, the ion shield 210 is supported above the substrate support 202 at distance of about 2 to about 4 inches above the substrate 206 in a process chamber having a substrate to ceiling distance of about 6 inches. Other support heights may be used in chambers having other configurations.

The ion shield 210 is supported using any suitable structure in a manner that maintains the ion shield 210 in a substantially parallel orientation with respect to the substrate 206 or the substrate support 202. In some embodiments, the shield support element 238 is a ledge 242, as depicted in FIG. 2A, attached to the chamber wall 204 (or to a process cavity liner disposed along the chamber wall) and supporting the ion shield 210 above the substrate support 202. In some embodiments as shown in FIG. 2B, the shield support element 238 is a stand 244 coupled to a bottom of the process chamber 200 and located around an outer perimeter of the substrate support 202, or a stand 244 having a lift mechanism 246 (e.g., an actuator, a motor, combinations thereof, or the like) to raise and lower the ion shield 210, or any other suitable structure within the process chamber 200.

For example, in some embodiments, a lift mechanism 246 may be coupled to the ion shield 210 to control the position of the ion shield 210 with respect to the substrate support 202, for example over a range extending above and below the slit valve 224. The lift mechanism 246 can support the ion shield 210 (e.g., the lift mechanism can be the support element) or the lift mechanism 246 can move the ion shield 210 from resting on the support element to a position disposed above the support element (such as the ledge 242 shown in FIG. 2A). The lift mechanism 246 can raise the ion shield 210 from a first position above the substrate 206, but below the slit valve 224, to a second position above the slit valve 224 to allow the substrate 226 to enter and exit the processing chamber 200 from the slit valve 224. In some embodiments, the lift mechanism 246 is generally located around an outer perimeter of the substrate support 202. An upper end of the lift mechanism 246 may be press fit into a corresponding hole formed in the ion shield 210. Alternatively, the upper end of the lift mechanism 246 may be threaded into the ion shield 210 or into a bracket secured to an underside of the ion shield 210. Other fastening methods not inconsistent with processing conditions may also be used to secure the lift mechanism 246 to the ion shield 210.

In some embodiments, the support element for the ion shield 210 is made of conductive material. In some embodiments, the support element is anodized. In some embodiments, the support element is not conductive but is connected to a ground path. In some embodiments, the ion shield 210 may be part of an easily-replaceable process kit for ease of use, maintenance, replacement, and the like. It is contemplated that the ion shield 210 may be configured to be easily retrofitted in existing process chambers.

Figure 3:
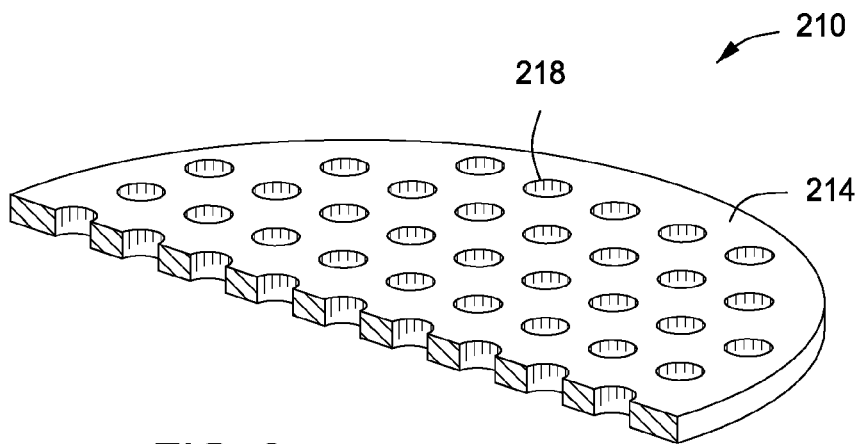
FIG. 3 depicts a partial perspective view of an ion shield in accordance with some embodiments of the present invention.

FIG. 3 depicts a perspective view of one specific embodiment of the ion shield 210. In some embodiments, the ion shield 210 comprises one or more substantially flat members 214 supported parallel to the substrate support 202 and a plurality of apertures 218 formed through the one or more flat members 214. In some embodiments, multiple flat members 214 having apertures 218 are stacked together in order to manipulate the quantity of ions that pass from a plasma formed in an upper processing volume 234 of the process chamber 200 to a lower processing volume 236 located between the ion shield 210 and the substrate 206. In some embodiments, the flat member 214, could comprise a plate, a screen a mesh, or a combination thereof.

The plurality of apertures 218 may vary in size, spacing and geometric arrangement across the surface of the plate 214. The plurality of apertures 218 control the quantity of ions that pass from a plasma formed in the upper processing volume 234 of the process chamber 200 to the lower processing volume 236 located between the ion shield 210 and the substrate 206. As such, the size and quantity of the apertures 218 affects the ion density in the lower processing volume 236. For example, the ion density may be substantially lowered, such that processing is predominantly provided by neutral radical species of the plasma.

The size of the apertures 218 generally range from about 0.03 inches (0.07 cm) to about 3 inches (7.62 cm), or from about 0.125 inches to about 1 inch. The apertures 218 may be arranged to define an open area in the surface of the plate 214 of from about 2 percent to about 90 percent. In one embodiment, the one or more apertures 218 includes a plurality of approximately half-inch (1.25 cm) diameter holes arranged in a square grid pattern defining an open area of about 30 percent. It is contemplated that the holes may be arranged in other geometric or random patterns utilizing other size holes or holes of various sizes.

In some embodiments, the size, shape and/or patterning of the holes may vary depending upon the desired ion density in the lower processing volume 236. For example, in some embodiments, a similar hole size may be provided in a geometric pattern having regions of relatively higher and lower numbers of holes to control the concentration of radicals in regions corresponding to the geometric pattern without altering the overall composition of the species reaching the substrate.

In some embodiments, the size, shape and patterning of the holes may vary depending upon the desired ion density in the lower processing volume 236. For example, more holes of small diameter may be used to increase the radical to ion density ratio in the lower processing volume 236. In other situations, a number of larger holes may be interspersed with small holes to increase the ion to radical density ratio in the lower processing volume 236. Alternatively, the larger holes may be positioned in specific areas of the plate 214 to contour the ion distribution in the lower processing volume 236.

In combination with the size of the apertures 218, the thickness of the one or more substantially flat members 214 may be selected to control the length of each aperture 218. The aspect ratio (i.e. the ratio of the diameter of the apertures 218 to the thickness of the one or more substantially flat members 214) of the ion shield 210 controls the ion density within the lower processing region 236. In some embodiments, the aspect ratio ranges from about 10:1 to about 1:10. In some embodiments, the aspect ratio ranges from about 2:1 to about 1:2.

FIG. 1 depicts one exemplary method 100 of processing a substrate using the processing chamber 200 described above. In some embodiments, at least some portions of the method 100 may be performed in a substrate processing chamber, for example, such as the chamber 200 described above with respect to FIGS. 2A and 2B (although other suitable process chambers may alternatively be used). Suitable process chambers that may be adapted in accordance with the teachings disclosed herein include, for example, a Decoupled Plasma Nitridation (DPN) reactor, or a toroidal source plasma immersion ion implantation reactor, such as the CONFORMA™ chamber, each of which are available from Applied Materials, Inc. of Santa Clara, Calif.

Figure 4A:
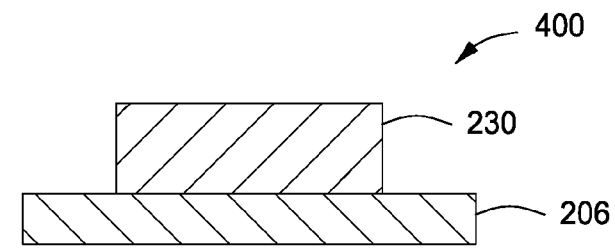
FIGS. 4A-4C depict stages of fabrication of a nitridized layer atop a substrate in accordance with some embodiments of the present invention.
Figure 4B:
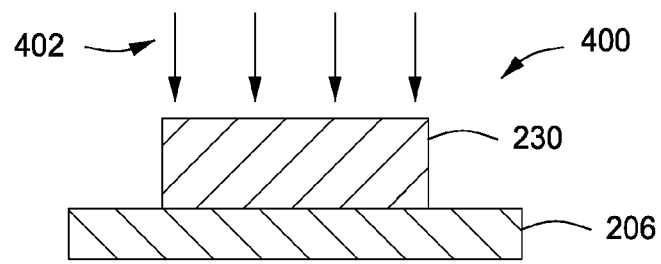
Figure 4C:
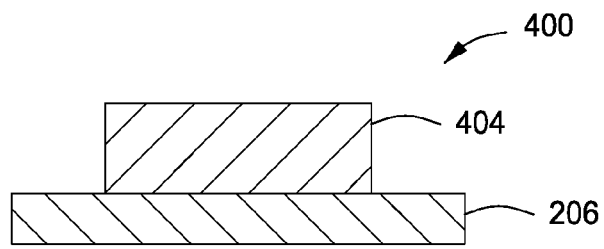

The method 100 is also described herein with respect to FIGS. 4A-4C, which depicts the stages of fabrication of a nitridized layer atop a substrate in accordance with some embodiments of the present invention. The stages of fabrication of a nitridized layer are depicted for illustrative purposes and do not limit the scope of the invention. For example, in some embodiments, the method 100 may be used to oxidize or etch a substrate 206.

The method 100 begins at 102, where a substrate 206 is disposed atop a substrate support 202 in a processing volume 208 of a process chamber 200 and beneath an ion shield 210 disposed over the substrate support 202.

The substrate 206 may have various dimensions, such as 200 mm, 300 mm, or other diameter wafers, as well as rectangular or square panels. The substrate 206 may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like.

The substrate 206 includes a first layer 230 to be processed. The first layer 230 may be defined by a base material of the substrate 206 (e.g., silicon) or by one or more layers disposed atop the base material. For example, the substrate 206 may include one or more completely or partially fabricated semiconductor devices 400, as depicted in FIG. 4A. The semiconductor device 400 may be completely or partially formed upon the substrate 206 and includes the first layer 230 to be processed, for example nitridized. The semiconductor device (when completed) may be, for example, a field effect transistor (FET), dynamic random access memory (DRAM), a flash memory device, or a 3D device, such as a 3D logic device, or other 3D devices requiring 3D conformal processing, such as nitridation, oxidation, or etch, or the like.

The first layer 230 may be, for example, utilized as a gate dielectric layer of a transistor device, a tunnel oxide layer in a flash memory device, a spacer layer atop a gate structure, an inter-poly dielectric (IPD) layer of a flash memory device, or the like. The first layer 230 may have any thickness suitable in accordance with the particular application for which the first layer 230 may be utilized.

The first layer 230 may comprise an oxide layer, such as silicon oxide ($SiO_2$), a metal oxide, hafnium oxide ($HfO_2$), hafnium silicate ($HfSiO_x$), or any suitable oxide layer used in a semiconductor device and requiring nitridation. For example, in some embodiments, the oxide layer may be a native oxide layer, or formed by any suitable oxidation process including the oxidation process discussed below. The first layer 230 need not be limited to an oxide layer, and other suitable layers may benefit from the inventive methods disclosed herein. For example, other suitable embodiments of the first layer 230 may include other silicon-containing layers such as SiC, or metal nitride layers, or the like. The first layer 230 can also be a stack of layers, such as a first sub-layer of $SiO_2$ and a second sub-layer of $HfO_2$ or a first sub-layer of $SiO_2$ and a second sub-layer of $HfSiO_x$, or the like.

The first layer 230 may be fabricated in one or more process chambers coupled to a cluster tool that also has the process chamber 200 coupled thereto. One example of a suitable cluster tool is a Gate Stack CENTURA®, available from Applied Materials, Inc., of Santa Clara, Calif.

Next, at 104, a process gas is flowed from a process gas source 222 into the upper processing volume 234 above the ion shield 210. In some embodiments, the process gas is a nitrogen containing process gas, such as ammonia ($NH_3$). The use of ammonia ($NH_3$) to form a plasma advantageously generates a thicker film atop the substrate 206 than a plasma formed using pure nitrogen. The nitrogen-containing process gas is provided at a flow rate of about 50 to about 1000 sccm, or from about 100 to about 500 sccm. In some embodiments, an inert gas, such as argon or helium, is also provided into the process chamber along with the nitrogen-containing process gas. Diluting ammonia in an argon ambiance advantageously enhances the dissociation of ammonia and, thus, increases the nitridation rate. The ammonium/argon process gas is provided at a total flow rate of about 100 to about 2000 sccm, or about 200 to about 1000 sccm. The ammonia may be about 1% to about 99%, or about 2.5 to about 25%, of the process gas. In some embodiments, the process gas is an oxygen containing gas, such as oxygen ($O_2$), ozone ($O_3$), or water ($H_2O$) vapor, suitable for an oxidation process or a halogen containing gas, such as chlorine ($Cl_2$), fluorine ($F_2$), bromine ($Br_2$), nitrogen trifluoride ($NF_3$), trifluoromethane ($CHF_3$), hydrogen chloride (HCl), hydrogen bromide (HBr), or the like, suitable for an etch process.

Next, at 106 a plasma is formed in the process chamber 200 from the nitrogen-containing process gas by applying RF power from a plasma power source (such as plasma power source 216) coupled to the process chamber 200. The plasma is formed in the upper processing volume 234 of the process chamber 200. In some embodiments, RF power (continuous wave or effective pulsed power) is provided in a range of about 50 to about 3000 watts, or in some embodiments about 200 to about 1000 watts. RF power may be pulsed at a duty cycle of about 2 to about 50%. The pressure in the process chamber may range from about 2 mTorr to about 200 mTorr, or in some embodiments, about 10 to about 60 mTorr.

Optionally, at 108, a bias power of about 10 to about 2000 volts DC power, or about 10 to about 2000 watts RF power, may be applied by a bias power source 220 to the ion shield 210. Applying a bias power to the ion shield 210 advantageously applies a voltage to the ion shield 210 to enhance ion screening.

Next, at 110, which is depicted in FIG. 4B, the first layer 230 is treated using the neutral radicals 402 that pass through the ion shield 210 to the lower processing volume 236. The neutral radicals 402 that pass through the ion shield 210 are advantageously the dominant species, with little or no ions present. The inventors have discovered that a high ion concentration in the plasma results in a more vertical path for the ions attracted to the substrate, which leads to poor conformality in applications where top surfaces and sidewall surfaces need to be processed, such as in 3D devices, trenches, vias, or the like. Thus, the inventors have discovered that a reduced ion concentration in the plasma improves conformality in applications where top surfaces and sidewall surfaces need to be processed, such as in 3D devices, trenches, vias, or the like.

The inventors have further discovered that providing thermal energy, for example by heating the substrate, enhances such radical driven conformal processing results. For example, in a nitridation process, as depicted in FIG. 4C, the neutral radicals 402 result in a conformally nitridized first layer 404 atop the substrate 206. Alternatively, the substrate 206 can be conformally oxidized using neutral radicals that pass through the ion shield 210 by providing an oxygen-containing process gas. In some embodiments, the substrate 206 can be conformally etched using neutral radicals that pass through the ion shield 210 by providing an etchant species.

In some embodiments, the substrate 206 is heated while treating the first layer 230 using the neutral radicals 402 that pass through the ion shield 210. For example, the substrate 206 may be heated from about room temperature (about 30 degrees Celsius) to about 550 degrees Celsius, for example from about 350 to about 450 degrees Celsius. The pressure inside the process chamber 200 during nitridation is generally controlled at about 2 mTorr to about 200 mTorr, or in some embodiments, about 10 to about 60 mTorr. Although illustratively discussed above as treating the first layer 230 or forming a conformally nitridized first layer 404, the inventive methods disclosed herein can be used to advantageously conformally process substrates having three dimensional structures formed in one or many layers.

Thus, methods of nitridizing materials on substrates and apparatus for performing same have been disclosed herein. While the foregoing is directed to embodiments of the present invention, other and further embodiments of the invention may be devised without departing from the basic scope thereof.

The invention claimed is:

1. A method of processing a substrate having a first layer disposed thereon that is part of a 3D device disposed on or being fabricated on the substrate, the method comprising:

disposing a substrate atop a substrate support disposed in a lower processing volume of a process chamber beneath an ion shield having a bias power applied thereto, wherein the ion shield comprises a substantially flat member supported parallel to the substrate support, and a plurality of apertures formed through the flat member, and wherein the ratio of the diameter of the apertures to the thickness of the flat member has a range of about 10:1 to about 1:10;

flowing a process gas into an upper processing volume above the ion shield;

forming a plasma from the process gas within the upper processing volume;

treating the first layer with neutral radicals that pass through the ion shield; and heating the substrate to a temperature of up to about 550 degrees Celsius while treating the first layer.

2. The method of claim 1, wherein the process gas comprises a nitrogen containing process gas.

3. The method of claim 2, wherein the nitrogen-containing process gas is ammonia ($NH_3$).

4. The method of claim 3, wherein the process gas consists essentially of ammonia ($NH_3$) and an inert gas.

5. The method of claim 4, wherein the process gas includes about 1 to about 99 percent ammonia ($NH_3$), wherein about 50 to about 3000 watts of RF power is provided to form the plasma of the process gas, and wherein the process chamber is maintained at a pressure of about 2 to about 200 mTorr while treating the first layer.

6. The method of claim 1, wherein the plasma is formed by providing about 50 to about 3000 watts of RF power.

7. The method of claim 1, further comprising:
maintaining the processing volume at a pressure of about 2 to about 200 mTorr while treating the first layer.

8. The method of claim 1, further comprising:
applying the bias power at about 10 to about 2000 V DC or about 10 to about 2000 W of RF power to bias the ion shield.

9. The method of claim 1, wherein the ratio of the diameter of the apertures to the thickness of the one or more substantially flat members is about 2:1 to about 1:2.

10. The method of claim 1, wherein the first layer is a high-k dielectric layer, a metal nitride film, or a metal oxide film.

11. The method of claim 10, wherein the first layer is a hafnium-containing layer.

12. The method of claim 10, wherein the first layer is a stack of layers comprising a hafnium oxide layer ($HfO_2$) disposed atop a silicon dioxide layer ($SiO_2$).

13. The method of claim 1, wherein the process gas comprises an oxygen containing process gas, and wherein treating the first layer comprises oxidizing the first layer.

14. The method of claim 1, wherein the process gas comprises at least one of oxygen gas ($O_2$), ozone ($O_3$), or water ($H_2O$) vapor.

* * * * *